(12) United States Patent
Moriyama et al.

(10) Patent No.: US 11,594,661 B2
(45) Date of Patent: Feb. 28, 2023

(54) SEMICONDUCTOR NANOPARTICLES, SEMICONDUCTOR NANOPARTICLE DISPERSION AND OPTICAL MEMBER

(71) Applicant: SHOEI CHEMICAL INC., Tokyo (JP)

(72) Inventors: Takafumi Moriyama, Tokyo (JP); Ryosuke Motoyoshi, Tokyo (JP)

(73) Assignee: SHOEI CHEMICAL INC., Tokyo (JP)

( * ) Notice: Subject to any disclaimer, the term of this patent is extended or adjusted under 35 U.S.C. 154(b) by 234 days.

(21) Appl. No.: 16/958,108

(22) PCT Filed: Dec. 19, 2018

(86) PCT No.: PCT/JP2018/046863
§ 371 (c)(1),
(2) Date: Jun. 25, 2020

(87) PCT Pub. No.: WO2019/131401
PCT Pub. Date: Jul. 4, 2019

(65) Prior Publication Data
US 2020/0343411 A1 Oct. 29, 2020

(30) Foreign Application Priority Data
Dec. 28, 2017 (JP) .............................. JP2017-253303

(51) Int. Cl.
*H01L 33/02* (2010.01)
*H01L 33/26* (2010.01)
*C09K 11/88* (2006.01)
*B82Y 20/00* (2011.01)
*B82Y 30/00* (2011.01)

(52) U.S. Cl.
CPC ............ *H01L 33/26* (2013.01); *C09K 11/883* (2013.01); *B82Y 20/00* (2013.01); *B82Y 30/00* (2013.01)

(58) Field of Classification Search
CPC ......... H01L 33/34; H01L 33/30; H01L 33/28; H01L 33/32; H01L 33/24; H01L 33/04; H01L 33/02; C09K 11/70; C09K 11/615
See application file for complete search history.

(56) References Cited

U.S. PATENT DOCUMENTS

| 8,221,651 B2 | 7/2012 | Murase et al. |
| 9,334,440 B2 | 5/2016 | Jang et al. |
| 10,975,299 B2 | 4/2021 | Kim et al. |
| 11,091,690 B2 | 8/2021 | Kwon et al. |
| 2015/0083969 A1 | 3/2015 | Kim et al. |
| 2017/0179338 A1 | 6/2017 | Park et al. |
| 2017/0306227 A1 | 10/2017 | Ippen et al. |

FOREIGN PATENT DOCUMENTS

| CN | 106701059 A | 5/2017 |
| EP | 3184603 A1 | 6/2017 |
| JP | 2016517454 A | 6/2016 |
| KR | 20110091361 A | 8/2011 |
| WO | 2017188300 A1 | 11/2017 |

OTHER PUBLICATIONS

Cadmium-Free InP/ZnSeS/ZnS Heterostructure-Based Quantum Dot Light-Emitting Diodes with a ZnMgO Electron Transport Layer and a Brightness of Over 10 000 cd m-2, Wang et al., small 2017, 13, 1603962.*
Xu, S. et al., "Rapid synthesis of highly luminescent InP and InP/ZnS nanocrystals," Journal of Materials Chemistry, vol. 18, No. 23, May 16, 2008, 4 pages.
Clayden, N. et al., "Optical and Surface Characteristaion of Capping Ligands in the Preparation of InP/ZnS Quantum Dots," Science of Advanced Materials, vol. 1, No. 2, Jul. 2009, 14 pages.
Buffard, A. et al., "Mechanistic Insight and Optimization of InP Nanocrystals Synthesized with Aminophosphines," Chemistry of Materials, vol. 28, No. 16, Jul. 21, 2016, 10 pages.
Kim, S. et al., "Highly Luminescent InP/GaP/ZnS Nanocrystals and Their Application to White Light-Emitting Diodes," Journal of the American Chemical Society, vol. 134, No. 8, Feb. 3, 2012, 6 pages.
Virieux, H. et al., "InP/ZnS Nanocrystals: Coupling NMR and XPS for Fine Surface and Interface Description," Journal of the American Chemical Society, vol. 134, No. 48, Nov. 6, 2012, 8 pages.
Pietra, F. et al., "Tuning the Lattice Parameter in InxZnyP for Highly Luminescent Lattice-Matched Core/Shell Quantum Dots," American Chemical Society Nano, vol. 10, No. 4, Apr. 11, 2016, 9 pages.
Sahoo, Y. et al., "Chemically Fabricated Magnetic Quantum of InP:Mn," Journal of Physics and Chemistry, vol. 109, No. 32, Jul. 22, 2005, 5 pages.
Lim, K. et al., "Synthesis of blue emitting InP/ZnS quantum dots through control of competition between etching and growth," Journal of Nanotechnology, vol. 23, No. 48, Nov. 9, 2012, 8 pages.
Lim, J. et al., "InP@ZnSeS, Core@Composition Gradient Shell Quantum Dots with Enhanced Stability," Chemistry of Materials, vol. 23, No. 20, Sep. 30, 2011, 5 pages.
Li, L. et al., "One-pot Synthesis of Highly Luminescent InP/ZnS Nanocrystals without Precursor Injection," Journal of the American Chemical Society, vol. 130, No. 35, Aug. 8, 2008, 2 pages.
Lucey, D. et al., "Monodispersed InP Quantum Dots Prepared by Colloidal Chemistry in a Noncoordinating Solvent," Chemistry of Materials, vol. 17, No. 14, Jul. 12, 2005, 9 pages.

(Continued)

*Primary Examiner* — Haidung D Nguyen
(74) *Attorney, Agent, or Firm* — Alleman Hall Creasman & Tuttle LLP

(57) ABSTRACT

An object of the present invention is to provide semiconductor nanoparticles having high quantum efficiency and also high weather resistance. Semiconductor nanoparticles according to an embodiment of the present invention are semiconductor nanoparticles including at least, In, P, Zn, Se, S and a halogen, wherein the contents of P, Zn, Se, S and the halogen, in terms of molar ratio with respect to In, are as follows: 0.05 to 0.95 for P, 0.50 to 15.00 for Zn, 0.50 to 5.00 for Se, 0.10 to 15.00 for S, and 0.10 to 1.50 for the halogen.

8 Claims, 4 Drawing Sheets

(56) References Cited

OTHER PUBLICATIONS

European Patent Office, Extended European Search Report Issued in Application No. 18896526.3, dated Sep. 15, 2021, Germany, 9 pages.
Mordvinova, N. et al., "Highly luminescent core-shell InP/ZnX (X=S, Se) quantum dots prepared via a phosphine synthetic route," Dalton Transactions, vol. 46, No. 4, Dec. 15, 2016, 7 pages.
Mordvinova N. et al., "Highly luminescent core-shell InP/ZnX (X=S, Se) quantum dots prepared via a phosphine synthetic route," Royal Society of Chemistry, Dec. 14, 2016, 7 pages.

\* cited by examiner

SEMICONDUCTOR NANOPARTICLES, SEMICONDUCTOR NANOPARTICLE DISPERSION AND OPTICAL MEMBER

TECHNICAL FIELD

The present invention relates to semiconductor nanoparticles, a semiconductor nanoparticle dispersion and an optical member.

Priority is claimed on Japanese Patent Application No. 2017-253303, filed Dec. 28, 2017, the content of which is incorporated herein by reference.

BACKGROUND ART

Semiconductor nanoparticles that are microscopic to the extent that they exhibit a quantum confinement effect have a band gap that depends on the particle diameter. Since excitons in semiconductor nanoparticles formed by photoexcitation, a charge injection method or the like emit photons with an energy corresponding to a band gap due to recombination, when the composition and the particle diameter of the semiconductor nanoparticles are appropriately selected, light with a desired wavelength is emitted.

The full width at half maximum (FWHM) of light emission mainly depends on the particle size distribution and the color purity can be increased when particles with a uniform particle diameter are prepared. These properties are used for color displays, lighting, security inks, and the like.

For emission of visible light, Cd chalcogenide semiconductor nanoparticles or InP-based semiconductor nanoparticles are used. InP-based semiconductor nanoparticles are beneficial because they do not contain harmful Cd, but their quantum efficiency (QY) and FWHM are generally inferior to those based on Cd.

CITATION LIST

Patent Literature

Patent Literature 1: U.S. Patent Application Publication No. 2015/0083969
Patent Literature 2: U.S. Patent Application Publication No. 2017/0179338

SUMMARY OF INVENTION

Technical Problem

Semiconductor nanoparticles are generally prepared and used as a dispersion in which they are dispersed in a resin or a solvent.

When such a dispersion is particularly used for an optical member such as a film, it is important that the absorptance of the semiconductor nanoparticles with respect to excitation light (particularly, blue excitation light) be high and the quantum efficiency be high.

ZnS, which is widely used as a shell for InP-based semiconductor nanoparticles, has a large band gap, and absorbs hardly any blue light. Therefore, when the amount of ZnS increases, the absorptance of the semiconductor nanoparticles with respect to excitation light tends to decrease.

Similarly, ZnSe, which is widely used as a shell for InP-based semiconductor nanoparticles, also has a large band gap, and thus it absorbs hardly blue light. However, since ZnSe has a narrower band gap than ZnS, even if the shell is thickened, the decrease in the absorptance of excitation light can be reduced to some extent. However, there are problems that, when ZnSe as a shell is thickened, the light emission region of the InP-based semiconductor nanoparticles becomes different from a desired region, the thickness of the shell increases, and thus the particle diameter of all of the semiconductor nanoparticles increases, and when used for an optical component such as a film, the film thickness increases.

Accordingly, in order to improve the quantum efficiency of the semiconductor nanoparticles, it is desirable to make the shell as thin as possible.

However, depending on applications, the semiconductor nanoparticles may be left at a high temperature of about 200° C. in a process such as a semiconductor nanoparticle film formation step, or a semiconductor nanoparticle-containing photoresist baking step, or a solvent removal and resin curing step after semiconductor nanoparticles inkjet patterning. When left at a high temperature in the presence of oxygen, since emission characteristics of the semiconductor nanoparticles generally deteriorate, performing such a process under an inert gas atmosphere can be considered, although this incurs a high cost. Therefore, it is desirable to make a shell having a role of protecting semiconductor nanoparticles from external influences thick in order to improve weather resistance.

As described above, it is difficult to improve both the quantum efficiency and weather resistance of semiconductor nanoparticles because they have a tradeoff relationship.

An object of the present invention is to provide semiconductor nanoparticles which address the above conflicting problems and have high quantum efficiency and also high weather resistance.

Solution to Problem

The inventors have found the following solutions to the above problems.

Semiconductor nanoparticles according to an aspect of the present invention are semiconductor nanoparticles including at least, In, P, Zn, Se, S and a halogen, wherein contents of P, Zn, Se, S and the halogen, in terms of molar ratio with respect to In, are as follows:
0.05 to 0.95 for P,
0.50 to 15.00 for Zn,
0.50 to 5.00 for Se,
0.10 to 15.00 for S, and
0.10 to 1.50 for the halogen.
Here, in this application, a range expressed using "to" refers to a range including both end points.

Advantageous Effects of Invention

According to the present invention, it is possible to provide semiconductor nanoparticles having high quantum efficiency and also high weather resistance.

DESCRIPTION OF EMBODIMENTS (Semiconductor Nanoparticles and Ligand)

Semiconductor nanoparticles provided by the present invention are semiconductor nanoparticles including at least In, Zn, P, Se, S, and a halogen. The particle diameter of the semiconductor nanoparticles is preferably 1 nm to 20 nm and more preferably 1 nm to 10 nm. Here, at least one halogen is included.

The halogen is not particularly limited, and may be any of F, Cl, Br and I, and Cl is preferable. Furthermore, the surface of the semiconductor nanoparticles may be modified with a ligand.

Figure 1A:
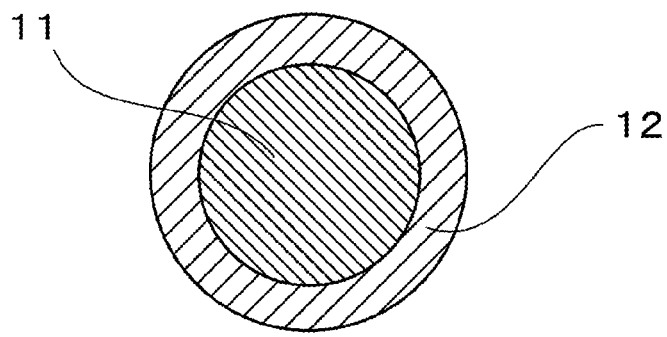
FIG. 1A is a diagram schematically showing an example of a form of semiconductor nanoparticles according to an embodiment of the present invention.
Figure 1B:
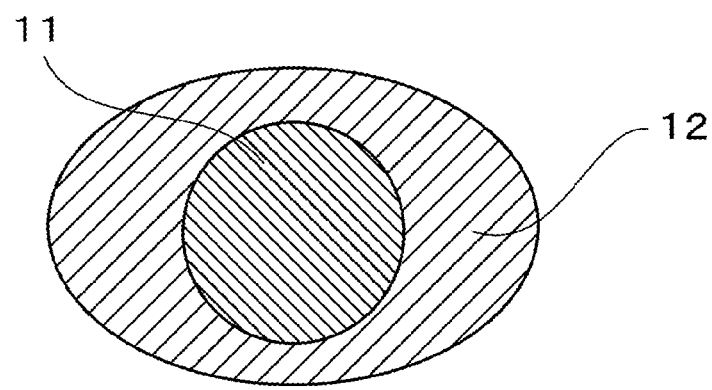
FIG. 1B is a diagram schematically showing an example of a form of semiconductor nanoparticles according to an embodiment of the present invention.
Figure 1C:
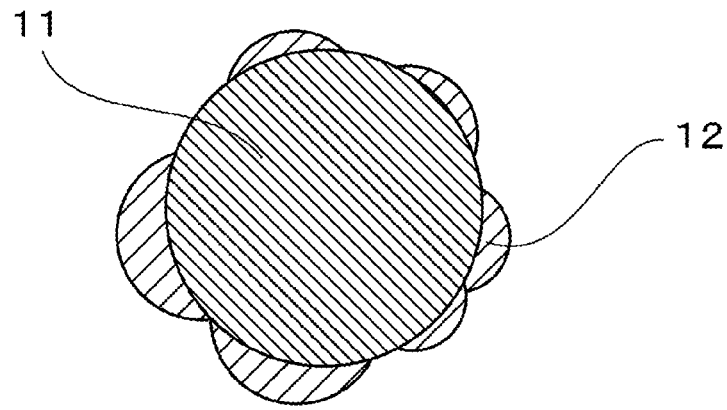
FIG. 1C is a diagram schematically showing an example of a form of semiconductor nanoparticles according to an embodiment of the present invention.
Figure 1D:
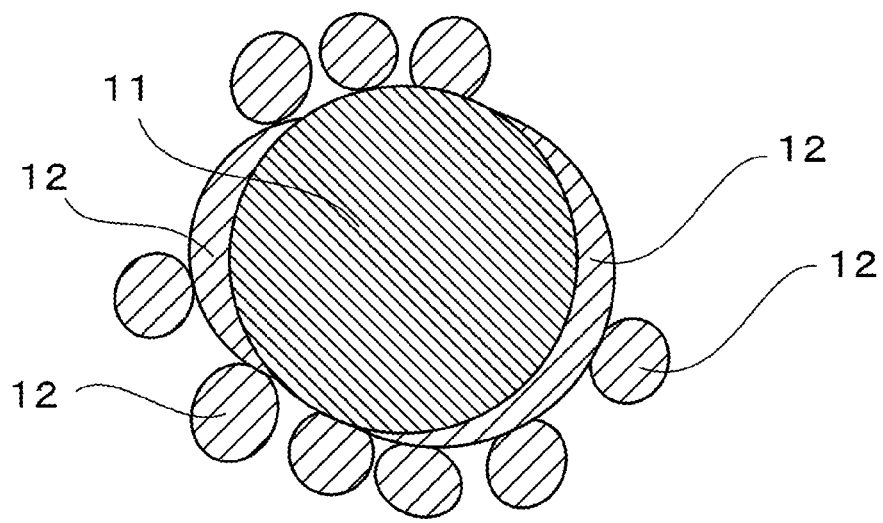
FIG. 1D is a diagram schematically showing an example of a form of semiconductor nanoparticles according to an embodiment of the present invention.
Figure 1E:
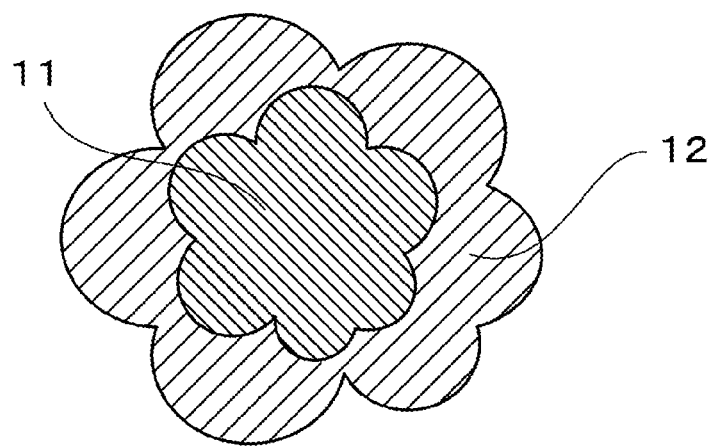
FIG. 1E is a diagram schematically showing an example of a form of semiconductor nanoparticles according to an embodiment of the present invention.

FIG. 1A to FIG. 1E show examples of embodiments of semiconductor nanoparticles. The semiconductor nanoparticles of the embodiments shown in FIG. 1A to FIG. 1E are composed of a core 11 and a shell 12, the core 11 is mainly composed of In, Zn, P, S, and a halogen, and the shell 12 is mainly composed of Zn, Se, S, and a halogen. Semiconductor nanoparticles according to one embodiment can have a structure in which the shell 12 covers the entire surface of the core 11 as shown in FIG. 1A and FIG. 1B. In addition, in semiconductor nanoparticles according to another embodiment, as shown in FIG. 1C, the shell 12 can be provided in an island shape on a part of the surface of the core 11. In semiconductor nanoparticles according to still another embodiment, as shown in FIG. 1D, the shell 12 as nanoparticles can be attached to the surface of the core 11 and can cover the core 11. In semiconductor nanoparticles according to still another embodiment, as shown in FIG. 1E, the core 11 may not be spherical.

However, preferably, the shell 12 covers the entire surface of the core 11 as shown in FIG. 1A and FIG. 1B, and more preferably, the shell 12 uniformly covers the entire surface of the core 11 as shown in FIG. 1A. In addition, the shell 12 may have a uniform element distribution inside the shell 12 or may have a concentration gradient. At the interface between the core 11 and the shell 12, a layer in which the above elements are mixed by diffusion may be formed.

The structure of the semiconductor nanoparticles of the present invention can be confirmed by detecting elements constituting the core and the shell and their concentration change using a scanning transmission electron microscope (STEM) through energy dispersive X-ray spectrometry (EDS).

In order for semiconductor nanoparticles to be stably dispersed in a matrix, the surface of the shell 12 may be modified with a ligand. In addition, as necessary, the ligand may be replaced and semiconductor nanoparticles be dispersed in a solvent with a different polarity, and the semiconductor nanoparticles can be bonded to another structure with the ligand.

Regarding the ligand, carboxylic acids, alkylphosphines, alkylthiols, and the like can be used. Particularly, those having a thiol group are suitable because they can strongly bind to and stably cover the surface of semiconductor nanoparticles.

Hereinafter, examples of synthesizing InP-based semiconductor nanoparticles will be disclosed.

(Core)

InP-based semiconductor nanoparticles are synthesized in the presence of elemental Zn. Elemental Zn inhibits a reaction of a P source. In addition, the inventors speculate that it binds to a part that may become a defective part on the surface of a growing InP nanocrystal and stabilizes the surface of the particles. Thereby, semiconductor nanoparticles having a reduced full width at half maximum (FWHM) and relatively high quantum efficiency (QY) are obtained.

In semiconductor nanoparticles according to an embodiment of the present invention, when the content of P, in terms of molar ratio with respect to In, is 0.05 to 0.95 and more preferably 0.40 to 0.95, a particularly excellent quantum efficiency can be achieved.

Examples of In precursors include indium carboxylates such as indium acetate, indium propionate, indium myristate and indium oleate, indium halides such as indium fluoride, indium chloride, indium bromide and indium iodide, indium thiolates, and trialkylindium, but the present invention is not limited thereto.

Examples of P precursors include tris(trimethylsilyl)phosphine, tris(trimethylgermyl)phosphine, tris(dimethylamino) phosphine, tris(diethylamino)phosphine, tris(dioctylamino) phosphine, trialkylphosphines and $PH_3$ gas, but the present invention is not limited thereto.

When tris(trimethylsilyl)phosphine is used as a P precursor, elemental Si may be incorporated into the composition of the semiconductor nanoparticles, but it does not impair the actions of the present invention. In addition, in the present invention, as long as the actions and effects of the present invention are not impaired, semiconductor nanoparticles may inevitably or intentionally contain elements other than In, P, Zn, Se and a halogen, for example, may contain elements such as Si and Ge. In the semiconductor nanoparticles, a total content of elements other than In, P, Zn, Se and a halogen, in terms of molar ratio with respect to In, may be 0.001 to 0.40.

Examples of Zn precursors include zinc carboxylates such as zinc acetate, zinc propionate, zinc myristate and zinc oleate, zinc halides such as zinc fluoride, zinc chloride, zinc bromide and zinc iodide, zinc thiolates, and dialkyl zinc, but the present invention is not limited thereto. Here, regarding the amount of Zn added, the content of Zn in core particles of semiconductor nanoparticles, in terms of molar ratio with respect to In, is preferably in a range of 0.50 to 5.00 and more preferably in a range of 0.50 to 3.50.

The In precursor, the Zn precursor, and a solvent are mixed to prepare a metal precursor solution. As necessary, a dispersant exemplified later can be added to the metal precursor solution. The dispersant is positioned on the surface of nanoparticles and has a function of preventing particles from aggregating and stably dispersing them in a solvent. Here, when the metal precursor contains one having a long carbon chain, since it acts as a dispersant, it is not always necessary to add a dispersant in that case.

Examples of dispersants include carboxylic acids, amines, thiols, phosphines, phosphine oxides, phosphinic acids, and phosphonic acids, but the present invention is not limited thereto. The dispersant can also serve as a solvent.

Examples of solvents include 1-octadecene, hexadecane, squalane, oleylamine, trioctylphosphine, and trioctylphosphine oxide, but the present invention is not limited thereto.

An S source is additionally added when core particles of InP-based semiconductor nanoparticles are synthesized. When the core particles contain a specific amount of S, a size distribution of the core particles can be further narrowed.

Examples of S sources include trioctyl phosphine sulfide, tributyl phosphine sulfide, thiols and bis(trimethylsilyl)sulfide, but the present invention is not limited thereto.

Here, regarding the amount of the S source added, the content of S in the core particles of the semiconductor nanoparticles, in terms of molar ratio with respect to In, is preferably 0.05 to 2.00 and more preferably 0.10 to 1.00.

Elemental Zn and S used here may be incorporated into the core particles of the semiconductor nanoparticles or may be present only on the surface.

In one embodiment, a metal precursor solution is including an In precursor, a Zn precursor, an S precursor, and a dispersant is added to a solvent as necessary are mixed under a vacuum, the metal precursor solution is first heated at 100° C. to 300° C. for 6 hours to 24 hours, a P precursor is then additionally added thereto, the mixture is heated at 200° C. to 400° C. for 3 minutes to 60 minutes and then cooled to obtain a core particle dispersion containing core particles.

(Halogen)

When a halogen precursor is additionally added to the core particles of the InP-based semiconductor nanoparticles, it is possible to improve a quantum efficiency (QY) of the InP-based semiconductor nanoparticles. The inventors speculate that, when a halogen is added, it links between $In^{3+}$ and $Zn^{2+}$ and fills a dangling bond, and has an effect of improving an effect of confining anions to electrons. In addition, the halogen provides high quantum efficiency (QY) and has an effect of minimizing aggregation of core particles. In semiconductor nanoparticles according to an embodiment of the present invention, the content of the halogen, in terms of molar ratio with respect to In, is suitably in a range of 0.10 to 1.50 and preferably a range of 0.20 to 1.40.

At least one halogen is selected. When two or more halogens are selected, a total amount of halogen in the semiconductor nanoparticles may be the above molar ratio with respect to In.

Examples of halogen precursors include HF, HCl, HBr, HI, carboxylic acid halides such as oleoyl chloride and octanoyl chloride, and metal halides such as zinc chloride, indium chloride and gallium chloride, but the present invention is not limited thereto.

The halogen in the form of indium halide or zinc halide can be added as the In or Zn precursor described above at the same time. The halogen precursor may be added before or after core particles are synthesized, or during synthesis, and for example, it may be added to the core particle dispersion.

In one embodiment, a halogen precursor is added to a core particle preparation solution, and a heat treatment is performed at 25° C. to 300° C., preferably 100° C. to 300° C., and more preferably 150° C. to 280° C., and thereby a core particle dispersion with added halogen is obtained.

Regarding the halogen, Cl having an ionic radius suitable for filling a dangling bond is particularly preferable.

(Shell)

When elemental Zn, Se and S are additionally added to the synthesized core particle dispersion or core particle dispersion with added halogen, it is possible to improve the quantum efficiency (QY) and stability.

It is thought that these elements mainly have a structure such as a ZnSeS alloy or ZnSe/ZnS heterostructure or an amorphous structure on the surface of core particles. Here, it is thought that some move into core particles by diffusion.

The added elements Zn, Se and S are mainly present on the surface of the core particles and have a role of protecting the semiconductor nanoparticles from external influences. The semiconductor nanoparticles according to an embodiment of the present invention may have a core/shell structure in which a shell covers the entire surface of the core as shown in FIG. 1A and FIG. 1B or a core/shell structure in which an island shape is partially formed due to a difference in the lattice constant as shown in FIG. 1C. In addition, as shown in FIG. 1D, a core/shell structure in which nanoparticles composed of uniformly nucleated ZnSe, ZnS, or alloys thereof are attached to the surface of the core and cover the surface may be used.

When the sum total of the number of moles of S and the number of moles of Se contained in the semiconductor nanoparticles, and the number of moles of Zn contained in the semiconductor nanoparticles are both large and the amount thereof is equal to or more than the amount which can cover the surface of the core particles, S, Se and Zn in the form of ZnS or ZnSe are mainly present on the surface of the core particles, and it is possible to improve weather resistance of the semiconductor nanoparticles. In addition, since the amount of ZnSe and ZnS present on the surface of the semiconductor nanoparticles is larger when the sum total of the number of moles of S and the number of moles of Se contained in the semiconductor nanoparticles and the number of moles of Zn contained in the semiconductor nanoparticles are both larger than the above amount, it is possible to further improve weather resistance of the semiconductor nanoparticles. On the other hand, since ZnS and ZnSe have a relatively large band gap, they cannot effectively absorb blue light, which causes a decrease in the absorptance.

In the semiconductor nanoparticles according to an embodiment of the present invention, when the number of moles of Zn in the semiconductor nanoparticles is reduced and is smaller than a total number of moles of S and moles of Se in the semiconductor nanoparticles, the amount of ZnS and ZnSe present on the surface of the semiconductor nanoparticles can be reduced, the shell can be thinned, and the absorptance can be increased.

In addition, surplus S and Se have a role of performing protection from external influences by adding a Zn—P bond of core particles, and can improve weather resistance.

In addition, comparing the particle diameter with InP-based semiconductor nanoparticles having the same emission wavelength, since the particle diameter as a whole becomes smaller, the number of semiconductor nanoparticles per unit dispersion amount increases when dispersed in a solvent, and when the semiconductor nanoparticles are used for an optical member such as a film, the film thickness can be reduced.

On the other hand, in conventional semiconductor nanoparticles (Patent Literature 1 and Patent Literature 2), the number of moles of Zn in the semiconductor nanoparticles is larger than the sum total of the number of moles of S and the number of moles of Se in the semiconductor nanoparticles. In this case, ZnS and ZnSe shells are formed on the surface of the semiconductor nanoparticles and weather resistance is improved, but the particle diameter of all of the particles increases, and the film thickness increases when the film is used for an optical member.

In the present invention, each number of moles of Zn, S and Se in semiconductor nanoparticles is preferably set to any number such that the number of moles of Zn in the semiconductor nanoparticles is smaller than a sum total of the number of moles of S in semiconductor nanoparticles and the number of moles of Se in semiconductor nanoparticles. When both elements S and Se are present in the shell, a decrease in the absorptance is reduced and weather resistance is improved. When the amount of Se is changed, it is possible to adjust the emission wavelength and the full width at half maximum.

Examples of a Zn precursor added when a shell is formed include zinc carboxylates such as zinc acetate, zinc propionate, zinc myristate and zinc oleate, zinc halides such as zinc fluoride, zinc chloride, zinc bromide and zinc iodide, zinc thiolates, and dialkyl zinc, but the present invention is not limited thereto. In addition, the Zn precursor added when a shell is formed may be the same Zn precursor as the Zn precursor added when a core is prepared or may be a different Zn precursor.

The amount of Zn, in terms of molar ratio with respect to In in the semiconductor nanoparticles, is suitably 0.50 to 15.00, preferably 2.50 to 10.00, more preferably 2.50 to 8.00 as a total of the amount of the Zn precursor added when core particles and shell(s) are formed. Since Zn is an element that forms a shell, if its amount is too small, the confinement effect is not obtained, and the quantum efficiency and the weather resistance deteriorate. On the other hand, if its amount is too large, since the amount of the entire shell that functions as a protecting layer increases, the weather resistance is improved, but the weight of inorganic components in the semiconductor nanoparticles increases, and the shell thickness increases, and thus the film thickness increases when used for an optical member such as a film.

Examples of Se precursors include trialkylphosphines, selenides and selenols, but the present invention is not limited thereto. The content of Se in the semiconductor nanoparticles, in terms of molar ratio with respect to In, may be 0.50 to 5.00 or more preferably 0.70 to 4.80, and thereby it is possible to further improve the quantum efficiency (QY) of the semiconductor nanoparticles.

Examples of an S source added when a shell is formed include trioctyl phosphine sulfide, tributylphosphine sulfide, thiols and bis(trimethylsilyl)sulfide, but the present invention is not limited thereto. In addition, the S source added when a shell is formed may be the same S source as the S source added when a core is prepared or a different S source. Sulfur has an effect of stabilizing semiconductor nanoparticles according to addition of S to Zn—P and also forming —Zn—S—Zn—S-bonds and covering the surface of the nanoparticles. The content of S in the semiconductor nanoparticles, in terms of molar ratio with respect to In in the semiconductor nanoparticles, is suitably 0.10 to 15.00 as a total of the amount of the S source added when a core particles and shell(s) are formed.

In one embodiment, a Zn precursor and an Se precursor are added to the above ore particle dispersion with added halogen, and the mixture is then heated at 150° C. to 300° C. and more preferably at 180° C. to 250° C., and a Zn precursor and an S precursor are then added thereto, and the mixture is then heated at 200° C. to 400° C., preferably at 250° C. to 350° C., and thereby semiconductor nanoparticles having a shell containing Zn, Se, and S can be obtained.

The precursors of the shell may be mixed in advance and added at once or in several portions or may be added separately at once or in several portions. When the precursors of the shell are added in a plurality of steps, heating may be performed by changing the temperature after each precursor of the shell is added.

The semiconductor nanoparticles obtained in this manner have a core/shell type structure having a shell that covers at least a part of the surface of the core particles and thus semiconductor nanoparticles having a narrow full width at half maximum of the emission spectrum can be obtained. A method of measuring an emission spectrum of semiconductor nanoparticles will be described later, but the full width at half maximum of the emission spectrum is preferably 40 nm or less.

In addition, when the core/shell type structure is provided, those having high quantum efficiency (QY) can be obtained. The quantum efficiency (QY) of the semiconductor nanoparticles is preferably 70% or more and more preferably 80% or more. This is about the same value as the quantum efficiency (QY) of conventional CdS-based semiconductor nanoparticles.

In addition, when the content of Zn in the semiconductor nanoparticles, in terms of molar ratio with respect to In, is set to 2.50 to 10.00, semiconductor nanoparticles having better heat resistance can be obtained. For example, when the semiconductor nanoparticles are heated under conditions of the atmosphere, 180° C. for 5 hours, the decrease in the quantum efficiency of the semiconductor nanoparticles after the heat treatment can be suppressed to 20% or less. That is, when the content of Zn in the semiconductor nanoparticles, in terms of molar ratio with respect to In, is adjusted to 2.50 to 10.00, and the quantum efficiency of the semiconductor nanoparticles dispersed in the dispersion before the heat treatment is set as QYa, and the quantum efficiency of the semiconductor nanoparticles dispersed again in the dispersion after the heat treatment is set as QYb, it is possible to satisfy QYb/QYa≥0.8. For QYb/QYa, it is more preferable that QYb/QYa≥0.9 be satisfied. In addition, the content of Zn in the semiconductor nanoparticles, in terms of molar ratio with respect to In, is more preferably 2.50 to 9.00 and still more preferably 2.50 to 8.00.

Here, when the content of Zn, in terms of molar ratio with respect to In, is more than 10.0, the heat resistance is further improved, but the thickness of the shell increases, and the particle diameter of all of the semiconductor nanoparticles tends to increase. Therefore, the content of Zn, in terms of molar ratio with respect to In, is preferably 10.0 or less. Thereby, when the semiconductor nanoparticles are used for an optical component such as a film, the film thickness can be made thinner.

The semiconductor nanoparticles obtained in this manner can be further purified. In one example, when a polarity changing solvent such as acetone is added, semiconductor nanoparticles can be precipitated from the solution. Solid semiconductor nanoparticles can be collected through filtration or centrifugation. On the other hand, a supernatant containing unreacted starting material and other impurities can be discarded or reused. Then, the solid can be washed with an additional solvent, and dissolved again. This purifying process can be repeated, for example, 2 to 4 times or until a desired purity is obtained. Examples of other purification methods include aggregation, liquid-liquid extraction, distillation, electrodeposition, size exclusion chromatography and/or ultrafiltration, and any or all of the above purification methods can be used alone or in combination.

(Process)

In one embodiment, the above process can be performed in a batch process. In addition, in another embodiment, at least a part of the above process can be performed in a continuous flow process, for example, such as those described in International Patent Publications WO2016/

194802, WO2017/014314, and WO2017/014313, and International Application No. PCT/JP2017/016494.

Figure 2:
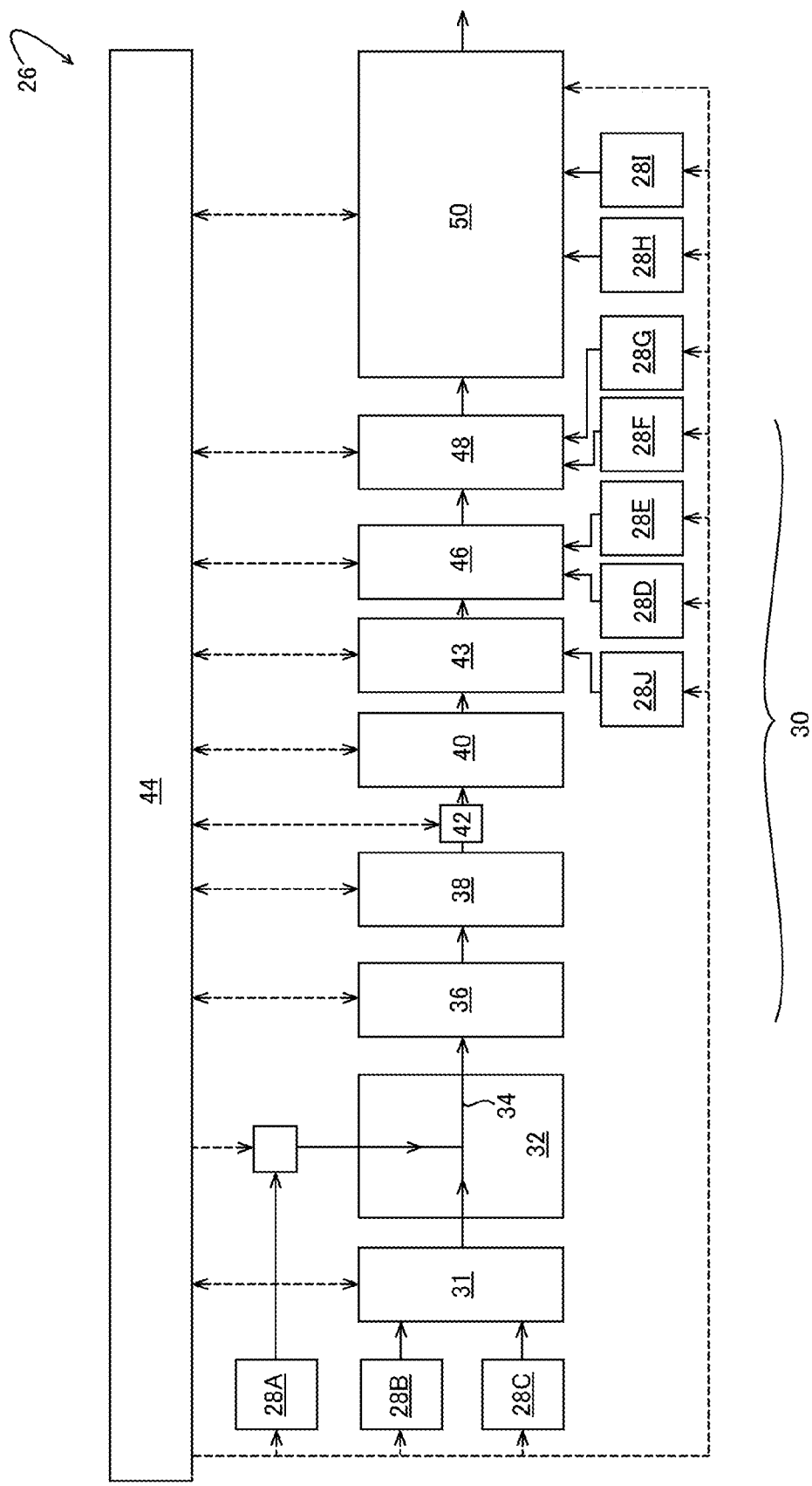
FIG. 2 is a diagram schematically showing an example of a continuous flow reaction system that can produce semiconductor nanoparticles according to an embodiment of the present invention.

Hereinafter, a method of preparing semiconductor nanoparticles will be described based on the continuous flow process described in International Application No. PCT/JP2017/016494. FIG. 2 shows a form of an example of a continuous flow reaction system 26. The continuous flow reaction system includes a plurality of fluid sources 28 (fluid source 28A to fluid source 28J). These may include, for example, a compressed gas cylinder, a pump, and/or a liquid reservoir. The continuous flow reaction system includes a plurality of reaction device 30 and a segmentation device 32. In the shown example, the fluid sources 28B and 28C can include, for example, an In source and a P source. Although not shown, the fluid sources 28 can include one or a plurality of fluid sources depending on the type of the precursor solution, and further include a fluid source containing a Zn source and an S source. In this case, a precursor mixing device 31 may or may not be provided before the segmentation device. When there is no mixing device, a plurality of fluid sources are mixed in the segmentation device.

The continuous flow reaction system 26 includes a reaction mixture flow path, and the flow path includes a main pipeline 34 through which a plurality of reaction devices 30 pass. The fluid source 28A is a non-reactive fluid (for example, a relatively inert gas such as nitrogen, argon, or helium) supply source, and in the segmentation device 32, the non-reactive fluid is introduced into the flow path from the fluid source 28A, and a reaction mixture segment flow is formed. This segment flow results in a narrower retention time distribution in the downstream reaction device than that without segmentation. The precursor mixing device 31 and the segmentation device 32 communicate with a process controller 44, control mixing of a plurality of fluid sources (for example, a stirring speed), and control the amount of the non-reactive fluid introduced.

The segmented reaction mixture and immiscible fluid are sent to an energy application activation stage 36 from the segmentation device 32, and energy is quickly applied to the mixture here using an energy source, for example, a single mode, a multimode, or a variable frequency microwave source, a light source such as a high energy lamp or a laser, a high temperature heating (for example, resistance heating) device, a sonic processing device, or any suitable combination of energy sources. Here, the semiconductor nanoparticles are quickly and uniformly nucleated. Then, a flow of the formed nuclei and precursors is sent to an incubation stage 38, and here, a heat source promotes growth of the nucleated precursors of a nanocrystalline core material under continuous flow conditions. In the process, quenching is performed in the collection stage 40, and here, a solution containing semiconductor nanoparticles can be optionally separated from an immiscible non-reactive fluid. In another embodiment, since nucleation and growth can be performed in the same reaction stage, the energy application activation stage 36 can be omitted.

In the example in FIG. 2, an analysis device 42 is arranged fluidly upstream from the collection stage 40. In the analysis device, one or more physical properties of the semiconductor nanoparticles exiting the incubation stage 38 can be examined and analyzed. In one example, the analysis device can communicate with the process controller 44. The process controller includes an electron control device that is linked so that various inputs of the fluid sources 28 and the reaction device 30 can be operated. Examples of such inputs include an energy flow rate in the energy application activation stage 36, heating of the incubation stage 38, and various flow control components arranged throughout the continuous flow reaction system 26. A closed loop feedback based on one or more properties analyzed in the analysis device can be used to automatically optimize or adjust the size, composition, and/or other properties of the semiconductor nanoparticles.

In FIG. 2, subsequently, the continuous flow reaction system 26 includes a halogen treatment stage 43 fluidly downstream from the collection stage 40, an intermediate shell production stage 46 fluidly downstream from the halogen treatment stage 43, and an external shell production stage 48 fluidly downstream from the intermediate shell production stage 46. The fluid source 28J connected to the halogen treatment stage 43 can contain a halogen precursor. The fluid sources 28D and 28E connected to the intermediate shell production stage 46 can contain, for example, a Zn precursor and a Se precursor source, respectively. The fluid sources 28F and 28G connected to the external shell production stage 48 can contain, for example, a Zn precursor and an S precursor source, respectively. The number of fluid sources connected to each stage is not limited to that shown in FIG. 2 and one or a plurality of fluid sources can be provided depending on the type of precursor. In addition, the halogen treatment stage 43, the intermediate shell production stage 46 and the external shell production stage 48 need not necessarily be divided into stages, but may be combined in one stage as necessary, or may be divided into more detailed stages. In addition, when the stages are divided, a fluid source may or may not be provided in each stage.

The continuous flow reaction system 26 in FIG. 2 also includes a purification stage 50 arranged downstream from the external shell production stage 48. The fluid sources 28H and 28I connected to the purification stage 50 can contain solvents, for example, acetone and octadecene, respectively. The number of fluid sources connected to the purification stage 50 is not limited to that shown in FIG. 2 and one or a plurality of fluid sources can be provided depending on the type of solvent required. Since various methods of purifying semiconductor nanoparticles are within the spirit and scope of this disclosure, the structure and function of the purification stage 50 of this disclosure may be different from those in other embodiments. Examples of such a method include aggregation, liquid-liquid extraction, distillation and removal of impurities through electrodeposition, and any or all of the above purification methods can be used in combination. However, in one embodiment, one method may be used and the other methods may be excluded.

(Measurement)

Elemental analysis of the semiconductor nanoparticles obtained in this manner is performed using a high frequency inductively coupled plasma emission spectrometer (ICP) and an X-ray fluorescence analysis device (XRF). In ICP measurement, the purified semiconductor nanoparticles are dissolved in nitric acid and heated, and then diluted in water and measurement is performed using an ICP emission analysis device (ICPS-8100 commercially available from Shimadzu Corporation) according to a calibration curve method. In XRF measurement, a filter paper impregnated with the dispersion is put into a sample holder, and quantitative analysis is performed using an X-ray fluorescence analysis device (ZSX100e commercially available from Rigaku Corporation).

In addition, optical properties of the semiconductor nanoparticles can be measured using a quantum efficiency measurement system (QE-2100 commercially available from Otsuka Electronics Co., Ltd.). The obtained semiconductor nanoparticles are dispersed in a dispersion, excitation light is applied to obtain an emission spectrum, and the quantum efficiency (QY) and the full width at half maximum (FWHM) are calculated from the emission spectrum after re-excitation correction obtained by excluding the amount of the re-excitation fluorescence emission spectrum of re-excitation fluorescence emission from the emission spectrum obtained here. Examples of dispersions include N-hexane and octadecene.

The heat resistance of semiconductor nanoparticles is evaluated using dry powder. A solvent is removed from the purified semiconductor nanoparticles, and heating is performed in the form of dry powder in the atmosphere at 180° C. for 5 hours. After the heat treatment, the semiconductor nanoparticles are dispersed again in the dispersion, and the re-excitation-corrected quantum efficiency (=QYb) is measured. When the quantum efficiency before heating is set as (QYa), the heat resistance before and after the heat treatment is calculated by the formula QYb/QYa.

(Applications)

The semiconductor nanoparticles are dispersed in a suitable organic substance or solvent, and used as a semiconductor nanoparticle dispersion. The viscosity of the dispersion is not limited. The semiconductor nanoparticle dispersion is used for an optical member such as a film. In the process of being used for an optical member, a semiconductor nanoparticle formation step, or a semiconductor nanoparticles-containing photoresist baking step, or a solvent removal and resin curing step after semiconductor nanoparticle inkjet patterning is performed. The semiconductor nanoparticles can form a thin film thickness while maintaining 90% or more of quantum efficiency (QY) even though these steps are performed with the above shell.

(Equivalents)

It can be understood that components and/or methods described in this specification are shown as examples, numerous modifications are possible, and thus these specific examples or examples should not be considered as limitations. Specific procedures or methods described in this specification may show one of a plurality of processing methods. Therefore, various operations explained and/or described may be performed in the order explained and/or described or may be omitted. Similarly, the order of the above methods can be changed.

The subject of this disclosure includes various methods, systems and components disclosed herein and novel and non-obvious combinations and subcombinations of other features, functions, operations, and/or properties, and all equivalents thereof.

EXAMPLES

InP-based semiconductor nanoparticles were prepared according to the following method, and the composition, optical properties, and temperature characteristics of the InP-based semiconductor nanoparticles were measured.

In preparation of semiconductor nanoparticles, precursors were prepared.

[Preparation of in Precursor Solution (Hereinafter Referred to as a Solution A)]

Indium acetate (0.075 mmol) was added to a mixture containing oleic acid (0.1875 mmol), 1-dodecanethiol (0.0375 mmol), and octadecene (2.44 mL), the mixture was heated at about 110° C. under a vacuum (<20 Pa), and reacted for 15 hours. The mixture reacted in a vacuum was left under a nitrogen atmosphere at 25° C. to obtain a solution A.

Example 1

0.30 mmol of indium acetate as an In precursor, 0.54 mmol of zinc oleate as a Zn precursor (hereinafter referred to as "Zn-1"), and 0.11 mmol of 1-dodecanethiol as an S source (hereinafter referred to as "S-1") were added to a mixture containing oleic acid (0.90 mmol) and octadecene (10 mL), and the mixture was heated at about 110° C. under a vacuum (<20 Pa), and reacted for 15 hours. 0.20 mmol of tris(trimethylsilyl)phosphine as a P precursor was added to the mixture reacted in a vacuum under a nitrogen atmosphere at 25° C., and the mixture was then heated at about 300° C. and reacted for 10 minutes. The reaction solution was cooled to 25° C., a total amount of the above solution A and 0.53 mmol of octanoic acid chloride as a halogen precursor were injected, and the mixture was heated at about 230° C. for 240 minutes. Then, 0.30 mmol of zinc oleate as a Zn precursor (hereinafter referred to as "Zn-2") and 0.30 mmol of tributylphosphine selenide as a Se precursor were injected and heated at about 200° C. for 30 minutes. Next, 0.60 mmol of zinc oleate as a Zn precursor (hereinafter referred to as "Zn-3") and 0.60 mmol of 1-dodecanethiol as an S source (hereinafter referred to as "S-2") were injected, the mixture was heated at a temperature of 250° C. for 60 minutes, and cooling was then performed at 25° C., and thereby a semiconductor nanoparticle dispersion solution was obtained.

Example 2

Semiconductor nanoparticles were synthesized in the same method as in Example 1 except that 0.23 mmol of a P precursor, 0.79 mmol of trimethylsilyl chloride as a halogen precursor, 0.38 mmol of an Se precursor, 1.18 mmol of Zn-3, and 0.71 mmol of S-2 were used, and the heat treatment after the halogen precursor was added was performed at about 270° C. for 30 minutes.

Example 3

Semiconductor nanoparticles were synthesized in the same method as in Example 1 except that 0.81 mmol of Zn-1, 0.25 mmol of a P precursor, 0.75 mmol of trimethylsilyl chloride as a halogen precursor, 0.38 mmol of an Se precursor, 0.93 mmol of Zn-3, and 0.75 mmol of S-2 were used, and the heat treatment after the halogen precursor was added was performed at about 270° C. for 30 minutes.

Example 4

Semiconductor nanoparticles were synthesized in the same method as in Example 1 except that 0.12 mmol of S-1, 0.6 mmol of Zn-3, and 0.58 mmol of S-2 were used.

Example 5

Semiconductor nanoparticles were synthesized in the same method as in Example 1 except that 0.45 mmol of Zn-1, 0.12 mmol of S-1, 0.96 mmol of Zn-3, and 0.61 mmol of S-2 were used.

Example 6

0.30 mmol of indium acetate as an In precursor, 0.54 mmol of zinc oleate as a Zn precursor (hereinafter referred to as "Zn-1"), and 0.09 mmol of 1-dodecanethiol as an S source (hereinafter referred to as "S-1") were added to a mixture containing oleic acid (0.90 mmol) and octadecene (10 mL), and the mixture was heated at about 110° C. under a vacuum (<20 Pa) and reacted for 15 hours. 0.20 mmol of tris(trimethylsilyl)phosphine as a P precursor was added to the mixture reacted in a vacuum under a nitrogen atmosphere at 25° C., and the mixture was then heated at about 300° C. The reaction solution was cooled to 25° C., 0.53 mmol of octanoic acid chloride as a halogen precursor was injected, and the mixture was heated at about 230° C. for 240 minutes. Then, 0.30 mmol of zinc oleate as a Zn precursor (hereinafter referred to as "Zn-2") and 0.30 mmol of tributylphosphine selenide as a Se precursor were injected and heated at about 200° C. for 30 minutes. Next, 0.60 mmol of zinc oleate as a Zn precursor (hereinafter referred to as "Zn-3") and 0.60 mmol of 1-dodecanethiol as an S source (hereinafter referred to as "S-2") were injected, the mixture was heated at a temperature of 250° C. for 30 minutes, and additionally, 0.50 mmol of zinc oleate as a Zn precursor (hereinafter referred to as "Zn-4") and 1.80 mmol of 1-dodecanethiol as an S source (hereinafter referred to as "S-3") were injected and the mixture was reacted for 30 minutes, and additionally 1.20 mmol of 1-dodecanethiol as an S source (hereinafter referred to as "S-4") was injected, the mixture was reacted for 30 minutes and cooled to 25° C., and thereby a semiconductor nanoparticle dispersion solution was obtained.

Example 7

Semiconductor nanoparticles were synthesized in the same method as in Example 6 except that 0.11 mmol of S-1 was used.

Example 8

Semiconductor nanoparticles were synthesized in the same method as in Example 6 except that 0.45 mmol of Zn-1 and 0.70 mmol of Zn-4 were used, and the heat treatment after the halogen precursor was added was performed at about 250° C., 60 minutes.

Example 9

Semiconductor nanoparticles were synthesized in the same method as in Example 6 except that 0.81 mmol of Zn-1, 0.60 mmol of a halogen precursor, and 0.35 mmol of Zn-4 were used.

Example 10

Semiconductor nanoparticles were synthesized in the same method as in Example 6 except that 0.18 mmol of a P precursor, 0.15 mmol of a Se precursor, and 0.45 mmol of Zn-4 were used.

Example 11

Semiconductor nanoparticles were synthesized in the same method as in Example 6 except that 0.81 mmol of Zn-1, 0.18 mmol of a P precursor, 0.45 mmol of a Se precursor, and 0.25 mmol of Zn-4 were used.

Example 12

Semiconductor nanoparticles were synthesized in the same method as in Example 6 except that 0.95 mmol of Zn-1, 0.18 mmol of a P precursor, and 0.20 mmol of Zn-4 were used.

Example 13

Semiconductor nanoparticles were synthesized in the same method as in Example 6 except that 0.12 mmol of S-1, 0.75 mmol of a halogen precursor, 0.60 mmol of Zn-2, 0.15 mmol of a Se precursor, 1.20 mmol of Zn-3, 1.20 mmol of S-2, 1.55 mmol of Zn-4, and 4.00 mmol of S-4 were used.

Example 14

Semiconductor nanoparticles were synthesized in the same method as in Example 6 except that 0.60 mmol of Zn-2, 1.20 mmol of Zn-3, 1.20 mmol of S-2, 0.65 mmol of Zn-4, and 2.80 mmol of S-4 were used.

Example 15

Semiconductor nanoparticles were synthesized in the same method as in Example 6 except that 0.60 mmol of Zn-2, 0.38 mmol of Zn-3, 1.20 mmol of Zn-3, 1.20 mmol of S-2, 1.55 mmol of Zn-4, and 4.10 mmol of S-4 were used, and the heat treatment after the halogen precursor was added was performed at about 250° C. for 30 minutes.

Example 16

Semiconductor nanoparticles were synthesized in the same method as in Example 6 except that 0.12 mmol of S-1, 0.60 mmol of Zn-2, 0.38 mmol of an Se precursor, 1.20 mmol of Zn-3, 1.20 mmol of S-2, 2.45 mmol of Zn-4, 3.60 mmol of S-3, and 5.90 mmol of S-4 were used, and the heat treatment after the halogen precursor was added was performed at about 250° C. for 30 minutes.

Example 17

Semiconductor nanoparticles were synthesized in the same method as in Example 6 except that 0.12 mmol of S-1, 0.60 mmol of Zn-2, 1.50 mmol of an Se precursor, 1.20 mmol of Zn-3, 1.20 mmol of S-2, 2.45 mmol of Zn-4, 3.60 mmol of S-3, and 2.40 mmol of S-4 were used, and the heat treatment after the halogen precursor was added was performed at about 250° C. for 30 minutes.

Comparative Example 1

Semiconductor nanoparticles were synthesized in the same method as in Example 6 except that 0.18 mmol of a P precursor, 0 mmol of a halogen precursor, and 0.60 mmol of Zn-4 were used.

Comparative Example 2

Semiconductor nanoparticles were synthesized in the same method as in Example 6 except that 0.45 mmol of Zn-1, 0.18 mmol of a P precursor, 0.15 mmol of a halogen precursor, and 0.70 mmol of Zn-4 were used, and the heat treatment after the halogen precursor was added was performed at about 250° C. for 30 minutes.

Comparative Example 3

Semiconductor nanoparticles were synthesized in the same method as in Example 6 except that 0.81 mmol of Zn-1, 0.18 mmol of a P precursor, 1.20 mmol of a halogen precursor, and 0.30 mmol of Zn-4 were used, and the heat treatment after the halogen precursor was added was performed at about 250° C. for 30 minutes.

Comparative Example 4

Semiconductor nanoparticles were synthesized in the same method as in Example 6 except that 0.45 mmol of Zn-1, 0 mmol of a Se precursor, and 0.70 mmol of Zn-4 were used, and the heat treatment after the halogen precursor was added was performed at about 250° C. for 30 minutes.

Comparative Example 5

Semiconductor nanoparticles were synthesized in the same method as in Example 6 except that 0.06 mmol of a Se precursor and 0.60 mmol of Zn-4 were used, and the heat treatment after the halogen precursor was added was performed at about 250° C. for 30 minutes.

Comparative Example 6

Semiconductor nanoparticles were synthesized in the same method as in Example 6 except that 0.81 mmol of Zn-1, 0 mmol of a halogen precursor, 1.20 mmol of a Se precursor, and 0.35 mmol of Zn-4 were used.

Comparative Example 7

Semiconductor nanoparticles were synthesized in the same method as in Example 6 except that 0.45 mmol of Zn-1, 1.50 mmol of a Se precursor, and 0.65 mmol of Zn-4 were use, and the heat treatment after the halogen precursor was added was performed at about 250° C. for 30 minutes.

Comparative Example 8

Semiconductor nanoparticles were synthesized in the same method as in Example 6 except that 0 mmol of a halogen precursor, 1.05 mmol of a Se precursor, and 0.60 mmol of Zn-4 were used.

Comparative Example 9

Semiconductor nanoparticles were synthesized in the same method as in Example 6 except that 0.45 mmol of Zn-1, 0.11 mmol of S-1, and 0.70 mmol of Zn-4 were used, and the heat treatment after the halogen precursor was added was performed at about 250° C. for 30 minutes.

Comparative Example 10

Semiconductor nanoparticles were synthesized in the same method as in Example 6 except that 0.11 mmol of S-1, 0.60 mmol of a P precursor, and 0.60 mmol of Zn-4 were used, and the heat treatment after the halogen precursor was added was performed at about 250° C. for 30 minutes.

Comparative Example 11

Semiconductor nanoparticles were synthesized in the same method as in Example 6 except that 0.10 mmol of Zn-1, 0.12 mmol of S-1, 0.02 mmol of Zn-2, 0.03 mmol of Zn-3, and 0 mmol of Zn-4 were used, and the heat treatment after the halogen precursor was added was performed at about 250° C. for 30 minutes.

Comparative Example 12

Semiconductor nanoparticles were synthesized in the same method as in Example 6 except that 0.81 mmol of Zn-1, 0.11 mmol of S-1, 0.60 mmol of Zn-2, 1.20 mmol of Zn-3, and 2.50 mmol of Zn-4 were used, and the heat treatment after the halogen precursor was added was performed at about 250° C. for 30 minutes.

Comparative Example 13

Semiconductor nanoparticles were synthesized in the same method as in Example 1 except that 0 mmol of S-1, 1.20 mmol of Zn-3, and 0.03 mmol of S-2 were used, and the heat treatment after the halogen precursor was added was performed at about 250° C. for 30 minutes.

Comparative Example 14

Semiconductor nanoparticles were synthesized in the same method as in Example 6 except that 0.45 mmol of Zn-1, 0.11 mmol of S-1, 0.23 mmol of a P precursor, 2.4 mmol of S-2, 3.6 mmol of S-3, and 3.6 mmol of S-4 were used, and the heat treatment after the halogen precursor was added was performed at about 250° C. for 30 minutes.

The obtained semiconductor nanoparticles were purified according to the following method.

The reaction solution obtained by synthesis was added to acetone, mixed well and then centrifuged. The centrifugal acceleration was 4000 G. A precipitate was collected, and N-hexane was added to the precipitate to prepare a dispersion. This operation was repeated a plurality of times and the purified semiconductor nanoparticles were obtained.

Composition analysis was performed on the purified semiconductor nanoparticles and optical properties and heat resistance thereof were measured.

The composition analysis was performed using the high frequency inductively coupled plasma emission spectrometer (ICP) and the X-ray fluorescence analysis device (XRF) as described above.

The optical properties were measured using the quantum efficiency measurement system as described above. In this case, excitation light had a single wavelength of 450 nm.

The heat resistance was evaluated according to the above method.

The composition analysis, optical properties, and heat resistance of the semiconductor nanoparticles are shown in Table 1.

TABLE 1

| | Compositional ratio | | | | | | Optical properties | | Heat resistance (QYb/QYa) |
|---|---|---|---|---|---|---|---|---|---|
| | [P]/[In] | [Zn]/[In] | [Se]/[In] | [S]/[In] | [Halogen]/[In] | ([Se] + [S])/[Zn] | Quantum efficiency (QY) [%] | FWHM [nm] | |
| Example 1 | 0.58 | 0.93 | 2.18 | 0.20 | 0.27 | 2.56 | 70.3 | 37.2 | 0.34 |
| Example 2 | 0.92 | 2.23 | 0.95 | 1.40 | 0.80 | 1.05 | 85.0 | 37.5 | 0.39 |

TABLE 1-continued

|  | Compositional ratio | | | | | | Optical properties | | |
|---|---|---|---|---|---|---|---|---|---|
|  | | | | | | | Quantum | | Heat |
|  | [P]/[In] | [Zn]/[In] | [Se]/[In] | [S]/[In] | [Halogen]/[In] | ([Se] + [S])/[Zn] | efficiency (QY) [%] | FWHM [nm] | resistance (QYb/QYa) |
| Example 3 | 0.75 | 2.35 | 1.21 | 1.39 | 0.67 | 1.11 | 83.0 | 37.5 | 0.35 |
| Example 4 | 0.56 | 1.21 | 2.14 | 0.70 | 0.19 | 2.35 | 77.1 | 37.7 | 0.32 |
| Example 5 | 0.46 | 2.36 | 0.79 | 1.97 | 0.30 | 1.17 | 70.4 | 39.0 | 0.36 |
| Example 6 | 0.46 | 5.49 | 1.39 | 5.15 | 0.40 | 1.19 | 82.4 | 38.9 | 0.92 |
| Example 7 | 0.46 | 4.44 | 1.45 | 4.19 | 0.47 | 1.27 | 80.7 | 39.4 | 0.95 |
| Example 8 | 0.51 | 3.40 | 1.42 | 2.61 | 0.33 | 1.19 | 84.4 | 38.2 | 0.92 |
| Example 9 | 0.47 | 2.65 | 1.49 | 2.51 | 0.37 | 1.51 | 83.7 | 38.3 | 0.92 |
| Example 10 | 0.59 | 5.85 | 0.86 | 6.46 | 0.84 | 1.25 | 77.1 | 39.2 | 0.98 |
| Example 11 | 0.38 | 5.71 | 1.26 | 5.73 | 0.47 | 1.22 | 78.0 | 39.0 | 0.94 |
| Example 12 | 0.18 | 5.41 | 1.49 | 4.42 | 0.14 | 1.09 | 77.2 | 38.6 | 0.94 |
| Example 13 | 0.30 | 9.56 | 1.11 | 9.08 | 1.35 | 1.07 | 71.3 | 39.6 | 0.98 |
| Example 14 | 0.47 | 8.16 | 2.23 | 6.17 | 0.90 | 1.03 | 79.7 | 38.9 | 0.96 |
| Example 15 | 0.17 | 11.10 | 3.20 | 8.56 | 0.73 | 1.06 | 71.2 | 39.6 | 0.99 |
| Example 16 | 0.07 | 14.40 | 3.80 | 12.10 | 0.51 | 1.10 | 70.5 | 39.8 | 1.00 |
| Example 17 | 0.14 | 14.80 | 4.70 | 10.50 | 0.62 | 1.02 | 73.5 | 39.7 | 1.00 |
| Comparative Example 1 | 0.59 | 5.90 | 0.93 | 6.17 | 0.00 | 1.20 | 32.4 | 44.8 | 0.92 |
| Comparative Example 2 | 0.56 | 5.71 | 0.92 | 5.79 | 0.08 | 1.18 | 41.4 | 44.5 | 0.80 |
| Comparative Example 3 | 0.19 | 4.99 | 1.42 | 4.31 | 1.61 | 1.15 | 11.0 | 83.2 | 0.91 |
| Comparative Example 4 | 0.58 | 6.97 | 0.00 | 7.66 | 1.32 | 1.10 | 68.7 | 48.3 | 0.80 |
| Comparative Example 5 | 0.57 | 6.08 | 0.28 | 6.52 | 1.21 | 1.12 | 65.1 | 46.1 | 0.82 |
| Comparative Example 6 | 0.33 | 4.56 | 4.28 | 6.33 | 0.00 | 2.33 | 10.6 | 88.7 | 0.65 |
| Comparative Example 7 | 0.29 | 5.41 | 5.35 | 5.96 | 0.23 | 1.91 | 35.1 | 43.1 | 0.94 |
| Comparative Example 8 | 0.21 | 5.63 | 3.87 | 4.88 | 0.00 | 1.55 | 11.2 | 97.0 | 0.70 |
| Comparative Example 9 | 0.03 | 5.33 | 1.32 | 5.03 | 0.44 | 1.19 | 12.3 | 69.6 | 0.90 |
| Comparative Example 10 | 1.14 | 5.17 | 1.30 | 5.71 | 0.39 | 1.36 | 9.8 | 81.0 | 0.91 |
| Comparative Example 11 | 0.42 | 0.30 | 1.42 | 6.22 | 0.49 | 25.47 | 58.1 | 77.2 | 0.58 |
| Comparative Example 12 | 0.58 | 15.90 | 1.33 | 5.56 | 0.41 | 0.43 | 45.0 | 46.8 | 0.95 |
| Comparative Example 13 | 0.70 | 5.69 | 1.49 | 0.05 | 0.37 | 0.27 | 31.5 | 60.8 | 0.72 |
| Comparative Example 14 | 0.61 | 5.08 | 1.28 | 16.60 | 0.40 | 3.52 | 36.8 | 55.7 | 0.91 |

REFERENCE CHARACTERS LIST

11 Core
12 Shell
26 Continuous flow reaction system
28A Fluid source
28B Fluid source
28C Fluid source
28D Fluid source
28E Fluid source
28F Fluid source
28G Fluid source
28H Fluid source
28I Fluid source
28J Fluid source
30 Reaction device
32 Segmentation device
34 Main pipeline
36 Energy application activation stage
38 Incubation stage
40 Collection stage
42 Analysis device
43 Halogen treatment stage
44 Process controller
46 Intermediate shell production stage
48 External shell production stage
50 Purification stage

The invention claimed is:
1. Semiconductor nanoparticles having a core/shell structure including at least, In, P, Zn, Se, S and a halogen, wherein the core comprises In, P, Zn, and S,
the shell comprises Zn, S, and Se, at least the core comprises the halogen,
contents of P, Zn, Se, S and the halogen, in terms of molar ratio with respect to In, are as follows:
0.05 to 0.95 for P,
0.50 to 15.00 for Zn,
0.50 to 5.00 for Se,
0.10 to 15.00 for S, and
0.10 to 1.50 for the halogen, and
a sum total of a number of moles of Se and a number of moles of S in the semiconductor nanoparticles is larger than a number of moles of Zn in the semiconductor nanoparticles.

2. The semiconductor nanoparticles according to claim 1, wherein the halogen is Cl.

3. The semiconductor nanoparticles according to claim 1, having a quantum efficiency (QY) of 70% or more.

4. The semiconductor nanoparticles according to claim 1, wherein a full width at half maximum (FWHM) of an emission spectrum of the semiconductor nanoparticles is 40 nm or less.

5. The semiconductor nanoparticles according to claim 1, wherein the content of Zn, in terms of molar ratio with respect to In, is
   2.50 to 10.00 for Zn, and
   a quantum efficiency (QYb) after heating at 180° C. for 5 hours in the atmosphere and a quantum efficiency (QYa) before the heating satisfy QYb/QYa≥0.8.

6. The semiconductor nanoparticles according to claim 1, wherein the content of Zn, in terms of molar ratio with respect to In, is
   2.50 to 10.00 for Zn, and
   a quantum efficiency (QYb) after heating at 180° C. for 5 hours in the atmosphere and a quantum efficiency (QYa) before the heating satisfy QYb/QYa≥0.9.

7. A semiconductor nanoparticle dispersion in which the semiconductor nanoparticles according to claim 1 are dispersed in a solvent.

8. An optical member including the semiconductor nanoparticles according to claim 1.

* * * * *